Aug. 10, 1954 L. E. BARTON 2,686,279

SEMICONDUCTOR DEVICE

Filed Sept. 28, 1949

Inventor

Loy E. Barton

By

Attorney

Patented Aug. 10, 1954

2,686,279

UNITED STATES PATENT OFFICE 2,686,279

SEMICONDUCTOR DEVICE

Loy E. Barton, Princeton, N. J., assignor to Radio Corporation of America, a corporation of Delaware Application September 28, 1949, Serial No. 118,428

7 Claims. (Cl. 317—235)

This invention relates generally to semi-conductor devices, and particularly relates to a novel process of preparing semi-conductor amplifiers or oscillators having a considerably higher gain than prior devices, and to devices so prepared.

The three-electrode semi-conductor has recently been developed as an amplifier or oscillator. This device, which has been termed a "transistor," has been disclosed in a series of three letters to the Physical Review by Bardeen and Brattain, Brattain and Bardeen, and Shockley and Pearson which appear on pages 230 to 233 of the July 15, 1948 issue. The new amplifier includes a block of a semi-conducting material such as silicon or germanium which is provided with two closely adjacent point electrodes called "emitter" and "collector" electrodes in contact with one surface region of the material, and a "base" electrode which provides a large-area, low-resistance contact with another surface region of the semi-conducting material. This amplifier provides voltage as well as current gain under proper operating conditions and may be considered as a three-terminal network having a common input and output terminal. Thus, the device is effectively a four-terminal network having a common input and output electrode which may, for example, be the base electrode.

The average power gain of a conventional three-electrode semi-conductor amplifier is of the order of 17 db (decibels). For many applications, this gain is too low. The gain of a semi-conductor amplifier may be increased to a certain extent by impressing the input signal on the base electrode, whereby the internal feedback of the device is utilized. However, the increase in gain which may thus be obtained is comparatively small. By utilizing an external feedback path, the gain of the semi-conductor amplifier may be further increased. However, even in that case, the stable gain is still not as high as may be required. It is, therefore, desirable to provide semi-conductor devices having higher power gain.

It is, accordingly, an object of the present invention to provide a novel process of preparing a three-electrode semi-conductor device suitable as an amplifier or oscillator, having improved properties and particularly a very much higher gain than previously known devices of this type.

A further object of the invention is to provide a semi-conductor amplifier or oscillator device which is protected from the deleterious influence of the atmosphere, thereby to maintain the high gain obtained by the novel treatment in accordance with the invention.

Briefly, a semi-conductor device is prepared in accordance with the present invention as follows: A semi-conducting crystal is ground in a conventional manner to obtain a substantially plane surface. From this surface a layer of the crystalline material is removed electrochemically. This is preferably effected by electrolytic anodization. It is believed that this treatment will provide a barrier layer at or near the thus treated surface. Two point electrodes are then provided on the treated surface. Preferably, the electrode which is to serve as the collector electrode is electroformed by passing pulses of electric current between the electrode and the crystal. This, presumably, breaks down partly the barrier layer and provides for a better noise-free contact.

The thus prepared device is then preferably protected from the action of the atmosphere, and particularly from moisture, by enclosing it in an air-tight housing in which a desiccant is provided.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figure 1:
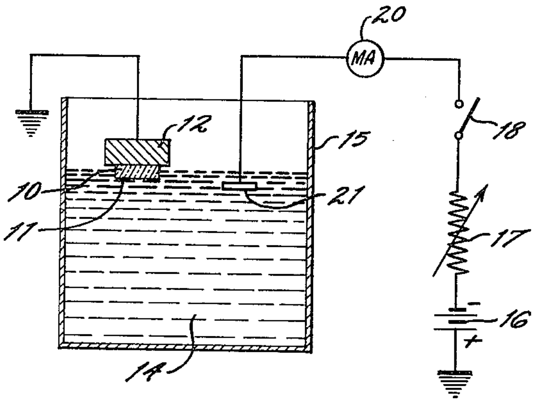
Figure 1 is a schematic illustration of the electrochemical treatment of a semi-conducting crystal in accordance with the invention.

In order to provide a semi-conductor device suitable as an amplifier or oscillator and having a high power gain, a semi-conducting crystal is treated electrochemically in accordance with the present invention. As illustrated in Figure 1, the semi-conductor device comprises a crystalline body 10 of a semi-conducting material consisting, for example, essentially of a chemical element having semi-conducting properties, such as germanium, silicon, boron, tellurium, or selenium. The semi-conducting crystal should contain a small but sufficient number of atomic impurity centers or lattice imperfections, as commonly employed for best results in crystal rectifiers. Germanium is the preferred material for block 10. Surface 11 of block 10 is preferably ground to obtain a substantially plane surface. However, it is not necessary to polish surface 11.

In accordance with the invention the thus prepared block 10 is now subjected to an electrochemical treatment. To this end, block 10 may be soldered or sweated to a metallic stem 12, which may, for example, consist of brass. The stem 12 may serve as a base electrode, providing a low-resistance, non-rectifying electrode. Block 10 is now immersed in an electrolyte 14 which may be an aqueous solution in a container 15. Preferably only block 10 is immersed in the aqueous solution. The solution 14 may, for example, consist of ordinary tap water, which contains enough salts and other impurities to conduct electricity to a certain extent. Alternatively, distilled water may be used, containing an alkali halide such as sodium chloride. Thus, solution 14 may consist of 0.5 N sodium chloride in distilled water. Alternatively, an aqueous solution of ethylene glycol bori-borate may be used.

In accordance with the present invention, an appreciable layer of germanium is now removed from surface 11 preferably by electrolytic anodization. Surface 11 may, for example, have an area of 45 x 45 mils. The removed germanium layer may have a thickness of the order of 1000 atoms or more. In any case, the electrochemical treatment is continued until all grinding marks are removed from surface 11. To this end, stem 12 may be grounded as illustrated. Battery 16 has its positive terminal grounded, while its negative terminal is connected through variable resistor 17, switch 18, and milliamperemeter 20 to an electrode 21, which also is immersed in solution 14. Electrode 21 may, for example, consist of brass or copper. Thus, crystal 10 is preferably connected to the positive pole of battery 16, while electrode 21 is connected to its negative pole. Battery 16 may, for example, have a voltage of the order of 22 volts, while resistor 17 may have a resistance of 5,000 ohms to limit the current flowing between electrode 21 and crystal 10.

When switch 18 is closed, a current of the order of 1 to 3 milliamperes is permitted to flow. When solution 14 consists of tap water, the current may be permitted to flow for approximately one hour. However, when the solution consists of one-half normal sodium chloride solution, the electrochemical action may be stopped after approximately ten minutes.

The electrochemical treatment will remove germanium from surface 11 and will dissociate the water so that hydrogen gas is developed which will escape. The thus formed new surface is glassy and smooth, but not necessarily flat or plane. Thus, an undisturbed and clean surface is formed by the electrochemical treatment.

At the present time, it is not possible to give an explanation as to the effect of this electrochemical treatment. However, it is believed that a sub-microscopic germanium dioxide film forms on the fresh surface 11. This film, however, is so thin that its existence could not be definitely ascertained. It is believed that this germanium dioxide film forms a barrier layer. Furthermore, it is believed that the electrolytic anodization removes all the mechanically disturbed and broken up crystal particles which are formed by the grinding and possibly by the previous cutting of the crystal. Accordingly, the newly formed surface 11 is believed to have no mechanically disturbed lattice portions. It is also believed that the electrochemical treatment will remove impurities, that is, foreign elements, which may either exist in the surface originally or which may be introduced through the grinding operation.

Figure 2:
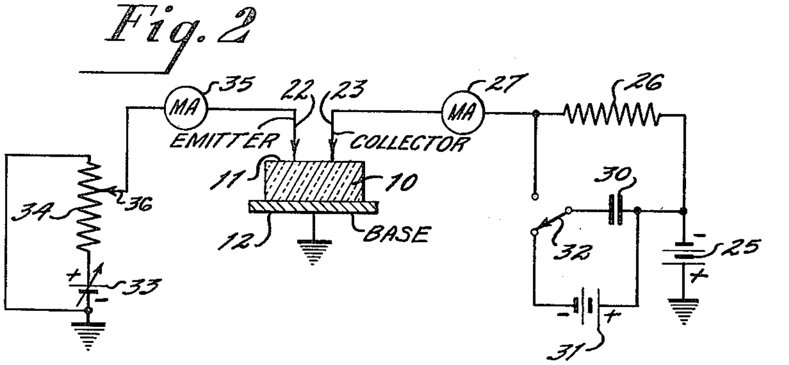
Figure 2 is a circuit diagram illustrating the electroforming treatment of the collector electrode of a semi-conductor device in accordance with the invention.

The thus treated crystal 10, with its stem 12, is now removed from solution 14, whereupon it is washed in water and dried. Thereafter, two point electrodes 22 and 23 are positioned on the freshly formed surface 11 in a conventional manner, as illustrated in Figure 2. Electrodes 22 and 23 preferably consist of thin Phosphor bronze wires having a diameter of approximately 5 mils and a sharp tip which may be formed by grinding. Electrodes 22 and 23 are preferably spaced between .5 and 1 mil apart. The pressure of the electrodes should be comparatively light to prevent damage to the barrier layer which is believed to exist on surface 11. Stem 12 has been shown schematically in Figure 2 as a base electrode, which may be grounded as shown.

In accordance with the present invention, one of the electrodes, such as electrode 23, which will later be used as the collector electrode, is electrically formed. To this end, the circuit of Figure 2 may be utilized. The collector electrode 23 is connected to the negative terminal of battery 25 through resistor 26 and milliamperemeter 27. The positive terminal of battery 25 is grounded, and is thus returned to the grounded base electrode 12. A capacitor 30 is normally connected across battery 31, the positive terminal of which is connected to the negative terminal of battery 25. Capacitor 30 may be discharged across resistor 26 by switch 32, which normally connects the capacitor across its battery 31. Emitter electrode 22 is supplied with a variable positive bias. To this end resistor 34 is connected across battery 33 having its negative terminal grounded. Emitter electrode 22 is connected to variable tap 36 on potentiometer 34 through milliamperemeter 35.

Current is now permitted to flow between the electrodes, that is, between emitter electrode 22, base electrode 12, and collector electrode 23. The voltage of battery 33 should be of the order of 1.5 volts and the emitter current should be limited to 3 to 4 ma. (milliamperes). The voltage of battery 16 may be about 45 volts and the resistance of resistor 17 may be about 5,000 ohms. The initial collector current may amount to 1 to 4 milliamperes. In accordance with the present invention, switch 32 is now closed to discharge capacitor 30 across resistor 26. During the electroforming of collector electrode 23 by electric pulses, current should preferably flow through emitter electrode 22. This will reduce the internal collector resistance, thus protecting the collector electrode from overheating. The thus obtained device has a higher power output when operated as a class A amplifier.

Capacitor 30 may have a capacitance of .01 mfd. and the voltage of battery 31 may be 135 volts. This current pulse is thus applied to collector electrode 23. The collector current now increases until, finally, the current is only limited by resistor 26 and may then amount to 9 milliamperes for the above values. It may be necessary to discharge capacitor 30 several times across resistor 26 to obtain the desired results.

Normally, it will not be necessary to subject emitter electrode 22 to this electroforming treatment. However, if emitter electrode 22 seems to have a noisy contact, or if it does not perform well, it is feasible to exchange electrodes 22 and 23 in the circuit of Figure 2. In that case, electrode 22 may now be electroformed in the manner above described. However, the last formed electrode should be made the collector electrode for best performance.

Again, no definite theory can be given as to the effect of the electrical forming of the electrodes. However, it is believed that the current pulses which flow through the treated electrode will increase to a certain extent the contact area by heating the electrode point. Furthermore, it is believed that a partial breakdown of the barrier layer takes place. It has also been found that it is essential that moisture be present during the electroforming treatment. Ordinarily, there will be enough moisture in the atmosphere to obtain good results. However, if the electroforming takes place in a vacuum, the results are not satisfactory.

A semi-conductor device prepared in the manner outlined hereinabove has an average power gain of the order of 30 db. However, individual units have been obtained with a power gain up to and exceeding 50 db. At the present time, it is believed that these extraordinarily high gains are due to the combined electrochemical treatment of the crystal and to the electroforming treatment of the electrodes. The internal emitter resistance of a typical unit is between 30 and 80 ohms, and its internal collector resistance is between 500 and 5,000 ohms. The emitter voltage may be between +.1 and +.45 volts and the collector voltage may amount to −13 to −25 volts. The emitter current may amount to 2 to 3 ma. and the collector current may be 4 to 25 ma.

It has been found that a semi-conductor device prepared in accordance with the invention is extremely sensitive to moisture. Its gain may drop appreciably within a few days, whereupon it usually reaches a stable value. Since germanium dioxide is soluble in water to a certain extent, it is possible that this sensitivity to moisture is due to a sub-microscopic germanium dioxide surface layer. Thus, in accordance with the invention, the finished semi-conductor device is protected against moisture and other deleterious influences of the atmosphere. To this end, surface 11 and electrodes 22 and 23 may be embedded in a suitable wax material. However, this has not always been found satisfactory. Accordingly, it is preferred to enclose the finished device in an air-tight housing containing a suitable desiccant such as phosphor pentoxid, calcium sulphate, silica gel or alumina.

Figure 3:
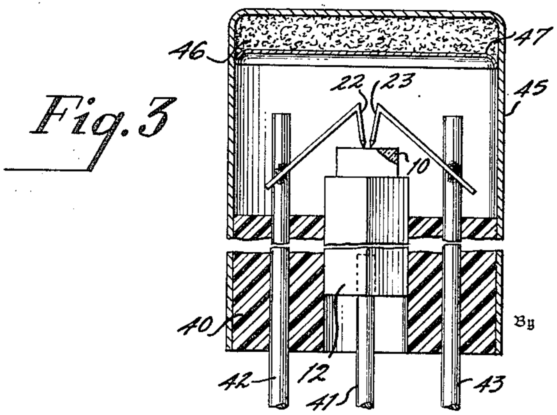
Figure 3 is a cross-sectional view of a semi-conductor device embodying the present invention.

A complete semi-conductor amplifier or oscillator device in accordance with the invention may take the form shown in Figure 3. A crystalline block 10 is mounted on stem 12 and is provided with two point electrodes 22 and 23. The construction of point electrodes 22 and 23 has been disclosed and claimed in a copending application of George M. Rose, Jr., filed April 30, 1949, Serial No. 90,702, now Patent No. 2,538,593, entitled "Semi-Conductor Amplifier Construction," and assigned to the assignee of this application.

Stem 12 preferably has a press fit with cylinder 40, which should consist of a suitable insulating material such as Bakelite. Stem 12 is provided with a heavy wire 41, while conductors 42 and 43 extend upwards through cylinder 40 for supporting electrodes 22 and 23. Conductors 41 to 43 extend below cylinder 40 and may be arranged for insertion in a sub-miniature tube socket. Housing 45 extends over cylinder 40 and encloses crystalline block 10 and electrodes 22 and 23. Housing 45 preferably has an air-tight fit with cylinder 40. In accordance with the present invention, a desiccant indicated at 46 is secured in any suitable manner to housing 45, to keep the atmosphere dry. To this end a partition 47 may be provided in the upper portion of housing 45 consisting of a porous material such as paper or of a perforated metal. Thus, the high gain of the semi-conductor device may be maintained over a considerable period of time.

There has thus been disclosed a novel process of preparing semi-conductor devices suitable as amplifiers, oscillators and the like. The thus obtained devices have an appreciably higher gain than previously known devices of this type. The finished semi-conductor devices preferably are kept in an air-tight housing containing a suitable desiccant to absorb moisture and thus prevent it from adversely affecting the high gain of the device.

What is claimed is:

1. The process of preparing a semi-conductor device which comprises the steps of grinding a germanium crystal until a substantially plane surface is obtained, electrochemically stripping a layer of germanium from said surface until substantially all grinding marks have disappeared and thereby oxidizing the thus prepared surface, positioning two point electrodes on the thus prepared surface, connecting a large-area electrode to another surface of said crystal, passing pulses of direct electric current between one of said point electrodes and said large-area electrode, enclosing said crystal and said electrodes in a substantially air-tight housing, and inserting a desiccant in said housing.

2. The process of preparing a semi-conductor device which comprises the steps of grinding a semi-conducting crystal until a substantially plane surface is obtained, electrochemically removing a layer from said surface until substantially all grinding marks have disappeared and thereby oxidizing the thus prepared surface, positioning two point electrodes on the oxidized surface, connecting a large-area electrode to another surface of said crystal, passing pulses of direct electric current between one of said point electrodes and said large-area electrode, enclosing said crystal and said electrodes in a substantially air-tight housing, and inserting a desiccant in said housing.

3. A semi-conductor device comprising a semi-conducting body obtained by electrochemically removing a layer from a surface of said body and oxidizing said surface, a plurality of electrodes in contact with said body, said electrodes including at least one point electrode in contact with said surface, said point electrode being formed by passing pulses of direct current between said point electrode and said body, a housing enclosing said body and said electrodes, and a desiccant in said housing.

4. A semi-conductor device comprising a semi-conducting body obtained by electrochemically removing a layer from a surface of said body and oxidizing said surface, a plurality of point electrodes in contact with said surface, one of said point electrodes being formed by passing at least one pulse of direct current between said one of said point electrodes and said body, a substantially air-tight housing enclosing said body and said electrodes, and a desiccant in said housing.

5. A semi-conductor device comprising a body of germanium having a surface film of germanium dioxide, a plurality of small-area electrodes in contact with said film, a large-area electrode in contact with said body, one of said small-area electrodes being formed by passing pulses of direct current between said one of said small-area electrodes and said body, a substantially air-tight housing enclosing said body and said electrodes, and a desiccant in said housing.

6. The process of preparing a semi-conductor device which comprises the steps of grinding a semi-conducting crystal until a substantially plane surface is obtained, electrochemically stripping a layer of material from said surface until substantially all grinding marks have disappeared and thereby oxidizing the thus prepared surface, positioning two point electrodes on the thus prepared surface, connecting a large-area electrode to another surface of said crystal, enclosing said crystal and said electrodes in a substantially air-tight housing, and inserting a desiccant in said housing.

7. A semi-conductor device comprising a body of semi-conducting material having a surface film formed as the result of an electrochemical etching operation, a plurality of small area electrodes in contact with said film, a large-area electrode in contact with said body, a substantially air-tight housing enclosing said body and said electrodes, and a desiccant in said housing.

References Cited in the file of this patent

UNITED STATES PATENTS

| Number | Name | Date |
|---|---|---|
| 2,402,661 | Ohl | June 25, 1946 |
| 2,447,829 | Whaley | Aug. 8, 1948 |
| 2,460,109 | Southworth | Jan. 25, 1949 |
| 2,469,569 | Ohl | May 10, 1949 |
| 2,476,989 | Martinet et al. | July 26, 1949 |
| 2,497,649 | Amsden | Feb. 14, 1950 |
| 2,577,803 | Pfann | Dec. 11, 1951 |
| 2,602,763 | Scaff et al. | July 8, 1952 |

FOREIGN PATENTS

| Number | Country | Date |
|---|---|---|
| 592,659 | Great Britain | Sept. 25, 1947 |